United States Patent [19]

Hodge et al.

[11] 4,420,767

[45] Dec. 13, 1983

[54] THERMALLY BALANCED LEADLESS MICROELECTRONIC CIRCUIT CHIP CARRIER

[75] Inventors: Robin H. Hodge, Menlo Park; Mark A. Brodsky, Sunnyvale, both of Calif.

[73] Assignee: Zilog, Inc., Calif.

[21] Appl. No.: 181,159

[22] Filed: Aug. 22, 1980

Related U.S. Application Data

[63] Continuation of Ser. No. 959,345, Nov. 9, 1978, abandoned.

[51] Int. Cl.³ ............................................. H01L 23/02
[52] U.S. Cl. ........................................ 357/81; 357/69; 357/70
[58] Field of Search .............................. 357/81, 69, 70

[56] References Cited

U.S. PATENT DOCUMENTS 3,590,328  6/1971  Frescura et al. .................... 361/388

Primary Examiner—Edward J. Wojciechowicz
Attorney, Agent, or Firm—Majestic, Gallagher, Parsons & Siebert

[57] ABSTRACT

A thermally balanced leadless microelectronic circuit chip carrier in which the chip is mounted directly on a heat sinking member by means of a conductive stress relieving polyimide. The heat sinking member, which has a support surface for the chip and an extending threaded shaft, is held by a carrier member thermally compatible with the surface on which the package is to be used. The shaft passes through the carrier member and receiving surface to a heat sinking nut which holds the package to the receiving surface. Leads on the carrier member surface are used to connect the receiving surface to the wires bonded to the chip contacts.

24 Claims, 6 Drawing Figures

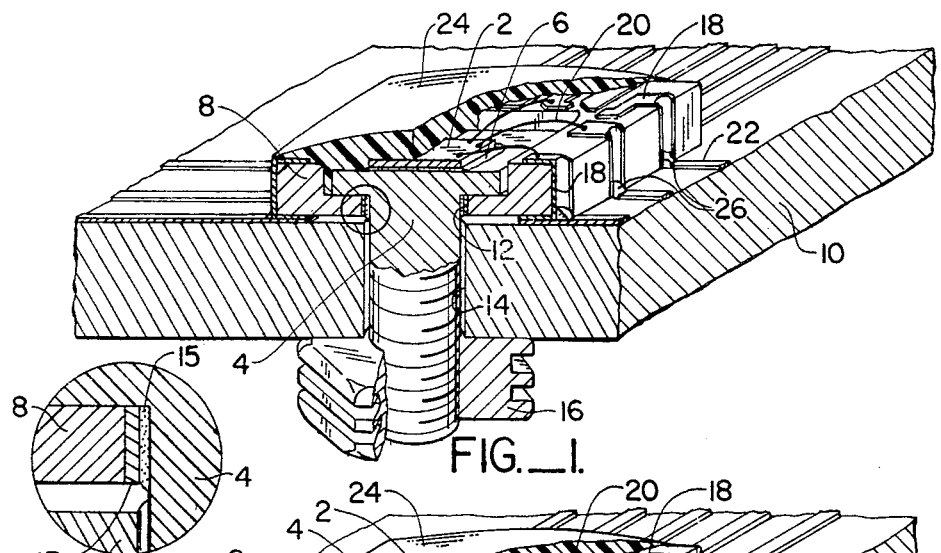
FIG._1.
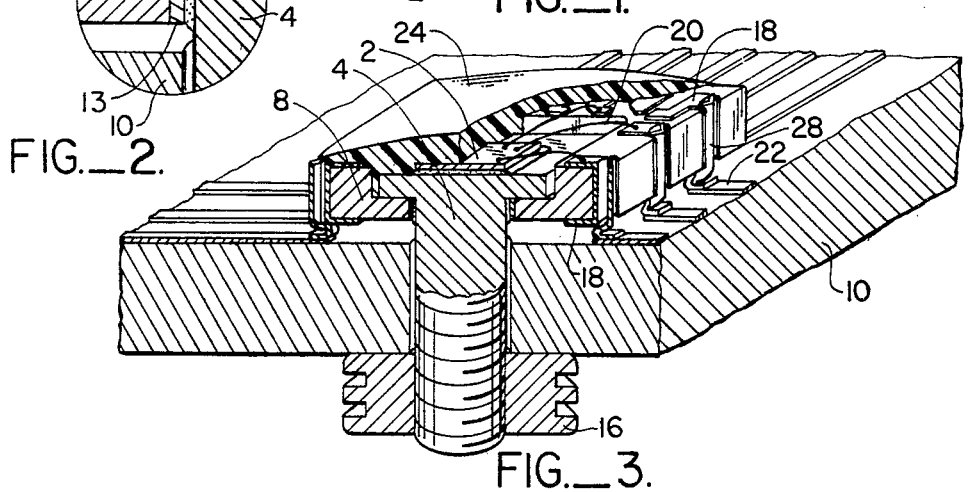
FIG._2.
FIG._3.
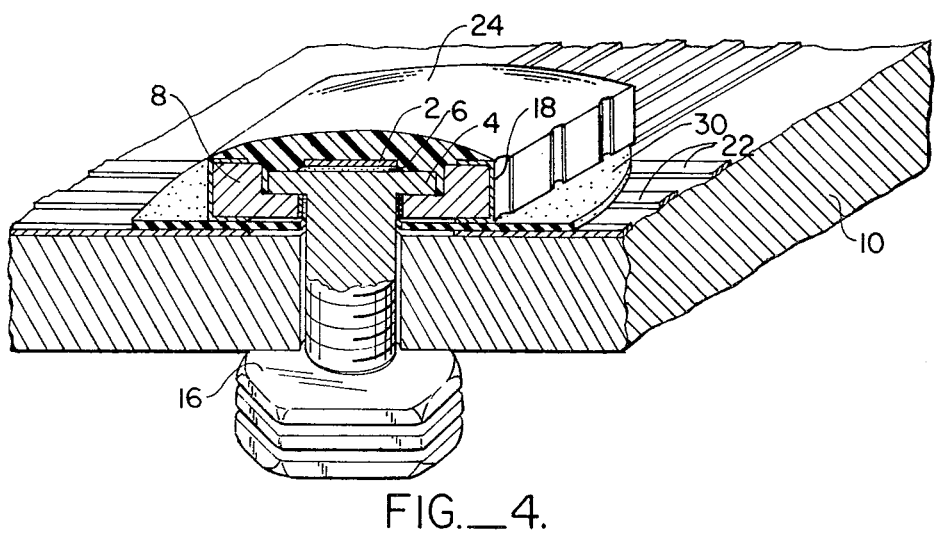
FIG._4.

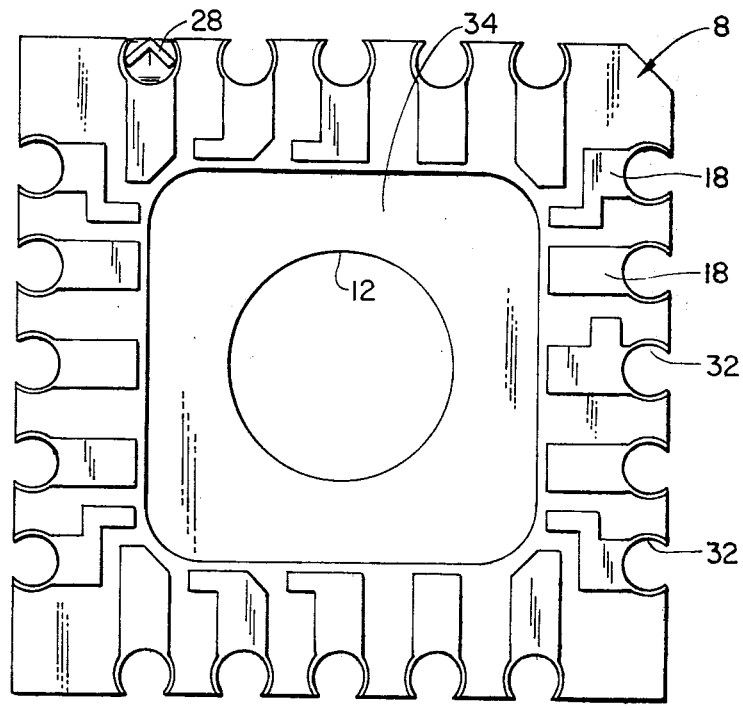
FIG.—5.
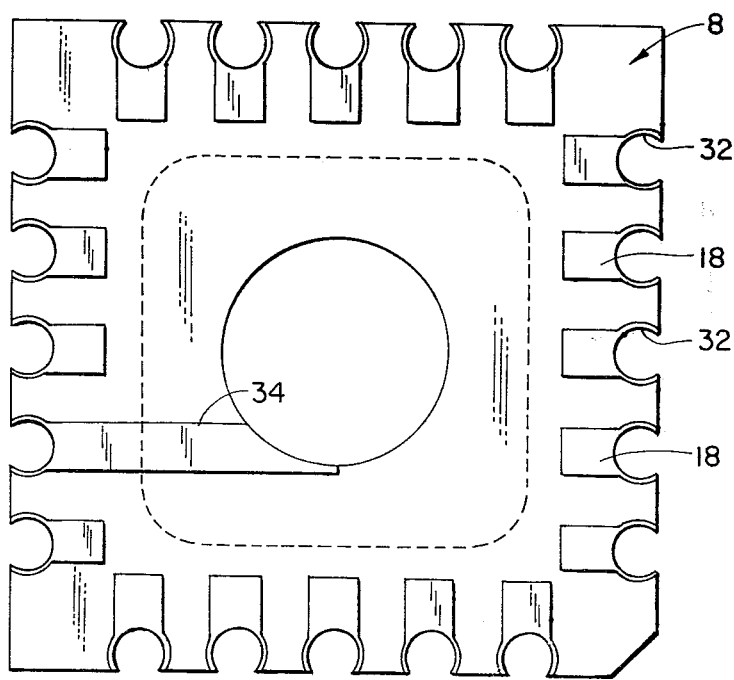
FIG.—6.

THERMALLY BALANCED LEADLESS MICROELECTRONIC CIRCUIT CHIP CARRIER

This is a continuation of Application Ser. No. 959,345, filed Nov. 9, 1978, now abandoned.

BACKGROUND OF THE INVENTION

The invention relates to microelectronic circuit chip packaging and more particularly to a thermally balanced leadless chip package.

A continuing problem in the manufacture of electronic equipment employing microcircuit chips has been the requirement of mounting or packaging the chip in such a way as to provide adequate heat sinking of the chip while permitting ease of mechanical and electrical connection and detachment between the package and its receiving surface, which is usually a printed circuit board.

Underlying the problem is the thermal incompatibility of the chip carrier material, ceramic, and the typical printed circuit board materials, such as triazine, polyimide and epoxy glass. A direct mounting of the chip carrier to a PC board would result in intolerable differential expansion causing fracture of the chip carrier and/or the stressing and eventual breakage of solder joints leads connected between the chip carrier and board, under all but benign temperature conditions.

Numerous prior art approaches have sought to solve this problem. In one arrangement, ceramic chip carriers are mounted to a ceramic mother board which in turn is connected to the PC board by stress relief leads. In another arrangement, the chip carrier is directly mounted to the PC board using stress relief leads. In some configurations, heat sinks have been brazed to the outside of the chip carrier.

In some prior art packages little or no attempt is made to heat sink the chip and in others, particularly in leadless chip carriers soldered to boards, the differential expansion problem is not treated. Thus, their applications are limited.

In memory applications, chip packages have generally been attached to boards by means of sockets to permit quick replacement of failed chips. Non-memory applications typically have the packages soldered to the board.

Heretofore, chip packages have not provided heat sinking in a leadless chip carrier that can be directly mounted to a board with non-soldered or soldered electrical connections.

A survery of various prior art approaches is set forth in an article "Packaging Technology Responds to the Demand for Higher Densities," by Jerry Lyman, *Electronics*, Sept. 28, 1978, Vol. 51, No. 20.

SUMMARY OF THE INVENTION

In accordance with the teachings of the invention a novel chip carrier is provided in which the chip is mounted directly to the heat sink with a heat conducting stress relieving mounting material. The heat sink provides a base for the chip and includes a threaded shaft which passes through a carrier member that holds the chip support portion of the heat sink and which mounts the package to a board by further passing through an aperture on the board. A heat sink nut on the opposite side of the board holds the assembly firmly to the board. The cup shaped carrier member, of the same material as the board, has an aperture for the threaded shaft, supports the chip and base portion of the heat sink and is adjacent to the board to provide thermal compatibility thereto. The carrier also has leads thereon for attaching wires from the chip. The carrier leads wrap around the outside of the carrier for connection to the board by various nonpermanent or permanent means. Alternatively, spring contacts or other means can provide contact to the board. A thermally compatible epoxy covers the exposed portion of the package assembly.

BRIEF DESCRIPTION OF THE DRAWINGS

FIG. 1 is a partially cut away sectional perspective view of the thermally balanced leadless microelectronic circuit chip package according to the present invention shown in place on a receiving printed circuit board.

FIG. 2 is an expanded view of the circled area in FIG. 1.

FIG. 3 is a view similar to FIG. 1 and depicting a further means of electrically connecting the package to the printed circuit board.

FIG. 4 is a further view similar to FIG. 1 and depicting yet a further means of electrically connecting the package to the printed circuit board.

FIG. 5 is a top plan view of the carrier member of the inventive package.

FIG. 6 is a bottom plan view of the carrier member of the inventive package.

DESCRIPTION OF THE PREFERRED EMBODIMENTS

Referring now to the drawings and particularly to FIGS. 1 and 2 thereof, a microelectronic circuit chip 2 is shown mounted on a thermally conductive member 4 which serves as a base for attachment of the chip and for conducting heat from the chip. A heat conductive stress relieving mounting material 6 attaches the chip 2 to the conductive member 4. A carrier member 8 holds the conductive member 4: member 8 is preferably formed of a material substantially thermally matched to the material of the receiving surface 10.

Thermally conductive member 4 has an elongated portion depending downward that passes through apertures 12 and 14 in the carrier member and receiving surface, respectively. The distal end of member 4 attaches to a further member 16. The downward depending portion of a member 4 is threaded and the further member 16 is a heat sinking nut that functions not only as a further heat sink but as a means to bind the package to the receiving surface.

A plurality of electrically conductive leads 18, applied by printed circuit board etching or additive plating techniques, for example, provide electrical connection between the chip, via wires 20, and leads 22 on the receiving surface 10.

A protective material 24, such as epoxy, covers the chip 2, wires 20 and adjacent portions of carrier member 8.

Various means for making electrical connection between the carrier member leads 18 and the receiving surface leads 22 are shown in FIGS. 1-4. In FIG. 1, solder 26 is applied at the points of contact. In FIG. 3, a plurality of electrically conductive spring clips 28 in contact with the leads 18 make contact with the receiving surface leads 22 when the nut 16 is tightened. In FIG. 4 a selectively conductive elastomeric washer 30 provides the contact when nut 16 is tightened to sufficiently compress the washer. Such materials are silicon rubber filled with silver and function to provide electrical conduction in the direction of compression and insulation at right angle to the direction of compression. The arrangement of FIG. 4 is preferred in view of the ease of attachment and detachment to the receiving surface and the ability to omit the spring clips. The FIG. 3 arrangement is preferred over that of FIG. 1 in that no soldering is required.

Silicon chip 2 has a thermal expansion coefficient of about $4 \times 10^{-6}$ in/in/C.°, whereas thermally conductive member 4 is preferably silver coated copper having a coefficient of about $16 \times 10^{-6}$ in/in/C.°. Nickel plated aluminum or other metals may also be usable. Thus, in order to attach the chip to member 4 a stress relieving conductive mounting material is required. If only heat conduction and not electrical conduction from the chip bottom to the member 4 is required, a thermally conductive polymer such as an alumina filled polymer is acceptable. However, many types of chips, particularly memory chips, require good electrical contact to the chip bottom surface. A silver filled polymer is commonly used for this purpose.

To enhance the conductivity of the chip back, a prior art technique can be employed wherein the silicon dioxide free chip surface is pre-doped with boron by ion implantation and then coated with a layer of gold. While this technique is expensive, the boron doping inhibits the establishment of a resistive silicon/gold junction which is common in P-type wafers.

Carrier member 8 is preferably the same material as the receiving surface 10. The latter is most likely a printed circuit board formed from industry standard materials such as, polyimide, triazine or glass base epoxy resin. Alternatively, the carrier member 8 can be formed from a different material than the receiving surface 10, such as ceramic or plastic, for example, however a substantial thermal characteristic match is preferred, particularly if the carrier is soldered to the PC board.

Wires 20 are bonded at the various chip contact points and at the various leads 18. Wires 20 may be formed from a good metal conductor such as aluminum or gold. The choice of gold permits a wider selection of epoxy for covering material 20 because gold does not work harden so readily. If aluminum wire is chosen, the epoxy must have a thermal characteristic that substantially matches that of aluminum. Subject to that limitation, the protective covering 20 can be formed from any suitable commercial epoxy.

FIGS. 5 and 6 show top plan and bottom plan views, respectively, of carrier member 8 in greater detail. The periphery of member 8 is generally square as viewed in plan with a plurality of circular cylindrical apertures 32 along this periphery. FIGS. 1-4 show fewer apertures 32 for simplicity. Each aperture 32 has an associated lead 18 that is applied by conventional printed circuit fabrication techniques, the lead extending from the top of member 8, through the inner wall of each aperture 32 and onto the bottom of member 8. The top portions of leads 18 are available for bonding to the chip, while the bottom portions of leads 18 are for connection to the printed circuit board receiving surface. The inner wall of each aperture 32 is exposed and accessible to contact probing while the complete device is mounted and in use. A centrally depressed area 34 is provided to hold the thermally conductive member 4 and a circular aperture 12 is provided for the threaded shaft portion of member 4. A triangular section is removed from one corner of member 8 to identify pin 1.

In order to avoid "down bonding", i.e., bonding a wire from a ground point on the chip to the member 4, when electrically conductive attachment is provided to member 4, the down bonded wire can be omitted and the inner periphery of aperture 12 made conductive with a plated or etched conductive surface 13 in contact with a lead 34 (FIG. 6). A conductive attaching material 15 is provided between surface 13 and the shaft of a member 4. Note particularly the expanded portion of FIG. 1.

In FIG. 5, one clip 28 is shown to illustrate further the manner in which the clips can be fitted into the slots 32.

If desired the shaft portion of member 4 can have a flat to match a keyed flat in apertures on the receiving board so that the package can be mounted in only one orientation.

Also, if desired the shaft of member 4 can have an alternative machining to permit the use of quick mounting clips or snaps instead of a threaded nut.

The invention can be practiced in ways other than as specifically shown in the drawings, for example, by inverting the package so that the heat sink shaft is upward and physical and electrical connection is made by soldering contacts 18 to the PC board.

I claim:

1. A heat sinking thermally balanced microelectronic circuit chip package, comprising:
   a high thermal conductivity member serving as a base for attachment of the chip thereto and for conducting heat from said chip,
   a heat conductive, thermal expansion stress relieving mounting material attaching said chip to said conductive member, and
   a substantially rigid electrically insulative carrier member attached to said conductive member adjacent said chip, but without any substantial contact with the chip or mounting material, said carrier extending outward of said conductive member and including a plurality of electrically conductive leads carried thereby for allowing electrical connection between said chip and a receiving surface.

2. The combination of claim 1 wherein the mounting material is a conductive polymer.

3. The combination of claim 1 wherein the attaching surface of the chip and the base member are electrically conductive.

4. The combination of claim 1 wherein said base member has an elongated portion formed for passage through apertures in said carrier member and a receiving surface for attachment to a further member and wherein said carrier member has an aperture for said elongated conductive member portion.

5. The combination of claim 4 wherein said further member binds said package to said receiving surface.

6. The combination of claim 4 wherein said further member provides further heat sinking of said chip.

7. The combination of claim 4 wherein said further member binds said package to said receiving surface and provides further heat sinking of said chip.

8. The combination of claim 1 further comprising a plurality of wires connecting contact points on said chip to individual ones of said plurality of electrically conductive leads.

9. The combination of claim 8 further comprising a protective covering material over said chip, wires and the portion of said carrier member in the vicinity of said chip.

10. The combination of claim 1 wherein said elongated portion is adapted to accept a compressive locking member and said further member provides heat sinking.

11. The combination of claim 1 wherein said carrier member further comprises a plurality of electrically conductive spring clips electrically connected to respective ones of said leads for contacting said receiving surface.

12. The combination of claim 8 further comprising a selectively conductive elastomer member interposed between said carrier member and a receiving surface for providing electrical contact between said electrical leads and said receiving surface.

13. The combination of claim 8 wherein at least one of said electrically conductive leads contacts the thermally conductive member to provide electrical contact to the chip mounting surface.

14. The combination of claims 1 or 4 wherein said carrier member is formed of a material substantially thermally matched to the material of a receiving surface.

15. The combination of claim 4 wherein said elongated portion has a keyed portion so that the package can be mounted with respect to a complementarily keyed receiving surface aperture in only one configuration.

16. The combination of claim 1 further comprising means for electrically connecting said electrically conductive leads and said receiving surface.

17. The combination of claim 16 wherein said means comprises a plurality of spring clips.

18. The combination of claim 16 wherein said means comprises a selectively conductive elastomeric sheet.

19. The combination of claim 1 wherein said leads are exposed for contacting by an external device.

20. The combination of claim 2 wherein the attaching surface of the chip and the thermally conductive member are electrically conductive.

21. The combination of claims 1 or 4 wherein said high thermal conductivity member is metallic.

22. A microelectronic circuit chip package, comprising:
an elongated base member characterized by having a high level of thermal conducivity,
a microelectronic circuit chip attached to one end of said base member in a heat conductive manner, whereby heat generated by said chip is carried by the base member to another end thereof,
an electrically and thermally insulative carrier member surrounding and extending outward from said base member adjacent its said one end in a direction substantially orthogonal with a longitudinal axis of the base member between its said one and another ends, said carrier and said circuit chip not touching each other, and
a plurality of electrical contacts attached to said carrier member that are electrically connected to said circuit chip by electrically conductive leads extending therebetween.

23. The package according to claim 22 which additionally comprises means provided on said base member adjacent said another end thereof for clamping said package to a receiving member such as a printed circuit board, said clamping means adapted to engage one side of a receiving member and the carrier member the other side.

24. The package according to claim 23 wherein said electrical contacts are carried on a side of said carrier member that faces said another end of the base member, thereby allowing said contacts to make electrical connection to electrical conductors carried by the receiving member when the package is clamped onto the receiving member.

* * * * *